(12) United States Patent
Brady et al.

(10) Patent No.: US 6,265,757 B1
(45) Date of Patent: Jul. 24, 2001

(54) FORMING ATTACHED FEATURES ON A SEMICONDUCTOR SUBSTRATE

(75) Inventors: Michael F. Brady, Morrisville, PA (US); Casimir R. Nijander, Lawrenceville, NJ (US); John W. Osenbach, Kutztown, PA (US); Michael G. Palin, Wyomissing Hills, PA (US); Aleksandra Yudina, Kutztown, PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/435,640

(22) Filed: Nov. 9, 1999

(51) Int. Cl.[7] .................................................. H01L 29/06
(52) U.S. Cl. ........................... 257/623; 156/647; 438/690
(58) Field of Search .................................... 438/500, 695, 438/33, 464; 156/653, 651, 644, 662, 661.1, 659, 657, 647; 257/622, 623, 627, 628

(56) References Cited

U.S. PATENT DOCUMENTS

| | | |
|---|---|---|
| 4,810,557 | 3/1989 | Blonder . |
| 4,863,560 | 9/1989 | Hawkins . |
| 4,957,592 | 9/1990 | O'Neill . |
| 5,006,202 * | 4/1991 | Hawkins et al. ..................... 156/644 |
| 5,096,535 | 3/1992 | Hawkins et al. . |
| 5,131,978 | 7/1992 | O'Neill . |
| 5,141,596 | 8/1992 | Hawkins et al. . |
| 5,277,755 | 1/1994 | O'Neill . |
| 5,385,635 | 1/1995 | O'Neill . |

* cited by examiner

Primary Examiner—Matthew Smith
Assistant Examiner—Calvin Lee
(74) Attorney, Agent, or Firm—Dickstein Shapiro Morin & Oshinsky LLP

(57) ABSTRACT

A method for creating attached features while controlling the depth profile between the features is presented. First the features are formed with a separating barrier between the features. The separating barrier is then etched in a second step with an orientation dependent etchant to attach the two feature. This method can be used to create attached features of relative similar sizes or attached features of disparate sizes.

13 Claims, 5 Drawing Sheets

FORMING ATTACHED FEATURES ON A SEMICONDUCTOR SUBSTRATE

FIELD OF THE INVENTION

This invention relates generally to the fabrication of semiconductor devices and more particularly to the fabrication of a smaller, shallow feature adjacent to a deeper feature.

BACKGROUND OF THE INVENTION

Liquid phase etching of semiconductor substrates provides one of the core technologies of the microelectronics industry. As the demands for smaller devices and more densely packed designs have increased, new methods of liquid phase etching have been developed to meet the technological challenge of manufacturing these smaller devices.

One feature of certain liquid phase etching processes is that they produce different etch rates along different crytallographic directions in the semiconductor substrate. For example, in an etch process with ethylene diamine pyrocatechol (EDP), an etching process which yields an etch rate of 60–70 microns per hour on an Si(100) surface may only etch an Si(111) surface at 1–3 microns per hour. Other orientation dependent etchants, such as KOH, also exhibit a disparity in etch rates for silicon substrates. The discussion below will focus on the use of orientation dependent etchants on silicon substrates. Those skilled in the art, however, will understand that this background discussion can be broadly applied to substrates of other materials which exhibit orientation dependent etching.

Due to the anisotropy of etch rate with respect to crystal direction, orientation dependent etchants (ODEs) are well-suited for creating pyramidal etch features on (100) surfaces. This is particularly true when an etch feature is created by exposing a rectangular portion of a (100) surface to an orientation dependent etchant. If the sides of the rectangle are properly aligned with the <110> directions, the orientation dependent etch will produce an etch pit with (111) sidewalls. The angle between the (111) surfaces and the (100) surface is 54.7 degrees. Based on this relationship, if the etch is allowed to proceed for a sufficient length of time, an etch feature will be produced which is defined by the intersection of (111) surfaces. If such a feature is etched to completion, the depth of the feature will be one half of the product of the smallest side of the original exposed rectangle and the tangent of 54.7. This calculated depth excludes any additional depth from overetching of the feature. Such overetching usually results in only a modest increase in depth, however, due to the greatly reduced etch rate for ODEs on (111) surfaces. This allows for a great deal of process flexibility, as an etch process may be continued for a significant length of time without appreciable overetching of a feature.

Due to the self-limiting nature of this type of etch process, features of disparate sizes may often be etched in a single step. As an example, it may be desirable to etch a small feature and a large feature during the same step. If both features are exposed to an orientation dependent etchant, less time will be required to form the limiting pyramidal shape of intersecting (111) surfaces in the small feature. Because of the slow etch rate on (111) surfaces, however, additional overetch will lead to only a modest amount of additional etching in the small feature. As a result, allowing the etch to proceed for a longer time in order to create a large, deeper feature will not lead to an appreciable change in the smaller etch feature. Thus, smaller and larger features can be created during a single etch step.

While this technique for creating smaller and larger features during a single etch step may be applicable in many situations, problems arise when it is desirable to etch a small, shallow feature, such as a notch, which is attached to a larger, deeper feature. FIGS. 1–3 schematically shows the difference between features which are near to each other and features which are attached. In FIG. 1, features 20 and 22 are only near one another. The height of barrier 24 between the features is substantially the same as the height of the substrate material 28. On the other hand, features 30 and 32 in FIG. 2 are attached. Although a barrier 34 is still present in the transition region between features 30 and 32, the height of barrier 34 is well below the height of the substrate material 38. Features 40 and 42 in FIG. 3 are also attached, although now no barrier is present. Instead, features 40 and 42 are joined via transition region 44.

For example, it may be desirable to control the shape and the depth of both a large feature and an attached small feature with a depth profile like the one shown in FIG. 3. The large feature and the attached small feature cannot be etched in the same step without losing control over the shape of at least one of these features. Because the features are attached, (111) surfaces will be unable to form in the transition region between the large feature and the attached small feature. Instead, a variety of surfaces will be exposed that etch rapidly in an ODE. This will lead to fast etching in the transition region and at the bottom of the small feature, resulting in a deeper small feature than desired and loss of a great deal of material from the transition region and the sidewall of the large feature where it meets the transition region.

One alternative to etching the large feature and attached small feature in a single process step is to etch the large feature during a first etch step and then to etch the entire attached small feature, including the transition region, during a second etch step. Splitting the etch into these two steps provides some additional control over the process, but difficulties still remain. A variety of crystallographic faces are present in the transition region between the attached small feature and the large feature. If the transition region is exposed to an ODE, the etch rate in the transition region will be faster than the etch rate on a (111) surface. As a result, it is difficult to control the etch depth in both the transition region and the attached small feature at the same time.

In U.S. Pat. No. 4,601,777, a method for creating a small channel near a large cavity is disclosed for use in making ink jet printer heads. The method involves a two step etching process. In the first step, the large cavity and the small channels are created using an anisotropic etch, such as KOH, but a barrier is left between the cavity and the channel. In the second step, the barrier is removed by either dicing, a mechanical means, or by an isotropic etch followed by an anisotropic, or orientation dependent, etch. The isotropic etch used in the invention is a mixture of HF, $HNO_8$, and $C_2H_4O_2$. This disclosure also notes the unsuitability of using only an orientation dependent etch to remove the barrier between the cavity and the channel.

U.S. Pat. No. 4,810,557 discloses a method for creating a tandem V-groove where a portion of the groove is shallow and narrow relative to the remainder of the groove. In this method, the attached shallow groove and deep groove are created by applying two etch masks. The pattern in the first mask determines the location of the grooves. The second mask is then deposited to prevent etching in the shallow groove during the initial stages of the etch.

U.S. Pat. No. 4,863,560 discloses a method for creating both large, coarse features and small, fine features without having to resort to lithography steps in between etching steps. Several etch masks are deposited prior to etching, with the mask for the largest, coarsest features at the top of the stack of masks. The masks are patterned as they are deposited without etching the underlying substrate. After all of the etch masks are formed, the first etch process is carried out. After the first etch process the coarse mask is removed, leaving behind a second etch mask. This process can be repeated to achieve finer and finer control over the etch features created. U.S. Pat. Nos. 5,131,978 and 5,277,755 disclose other methods for using multiple etch masks to create attached small and large features.

U.S. Pat. No. 4,957,592 discloses a method for creating small and large features at the same time using an erodable etch mask. The erodable etch mask is formed and patterned on the substrate. A non-erodable etch mask is then formed and patterned above the erodable layer. During the etch step, the erodable mask is slowly consumed by the etchant. As a result, the areas of the substrate covered only by the erodable mask are not etched initially, but are eventually uncovered. This allows for the etch to start in the areas covered by the erodable mask at a later point in time than the rest of the substrate, leading to an effectively shorter etch time for the areas covered by the erodable mask.

U.S. Pat. No. 5,096,535 discloses a method for creating small features attached to large features. The etching mask is patterned to expose the surface areas of the small and large features while leaving barriers between the features. These barriers between the features are consumed during the same etch step as the features by undercutting the etch mask.

Restricting etching of the barrier to undercutting of the etch mask, as in U.S. Pat. No. 5,096,535, may overcome some of the aforementioned problems associated with attempting to create both the large and small feature in a single step. To the degree that this is true, however, this technique introduces a new problem. If an ODE etch process is used to both create the small feature and remove the wall, the etch will proceed quickly on (100) surfaces and slowly on (111) surfaces. As (111) surfaces will quickly form in the small feature, removal of material from the 'wall' will proceed based on the etching rate of (111) surfaces. The slow etch in this direction may result in creation of a 'bump', or high point, in the transition region between the small feature and the large feature.

The slow etch rate of orientation dependent etchants on (111) surfaces highlights another difficulty in the current state of the art. In some applications, it may be beneficial to create two attached features where both features are relatively deep. In this case, the transition region between the feature could resemble the barrier shown in FIG. 2. Using the undercutting technique described above in U.S. Pat. No. 5,096,535, a barrier between two attached features can be consumed during the same process step used to form the two features. In this undercutting technique, however, the barrier is consumed due to etching (111) surfaces. While this will eventually lead to etching of the barrier, removal of more than a few microns from the barrier will take hours. If the height of the barrier must be reduced by more than just 1–3 microns, it would be desirable to have a method where the barrier could be etched at a much higher rate. This method, however, should also retain the (111) surface character of the barrier walls for any portions of the barrier which remain after the etch.

Accordingly, there is a need for an improved method of creating a small feature which is attached to a larger feature. The method should allow for creating the small attached feature without significantly degrading the sidewall depth profile of the small feature or the large feature. The method should avoid the difficulties of forming multiple etch masks on a substrate prior to etching. The method should also be relatively simple to implement and reproducible for use in production of microelectronic devices.

There is also a need for a method of creating large attached features with a barrier in the transition region. The method should be able to quickly and efficiently create the attached features. The method should also produce a barrier having sidewalls with (111) surfaces.

SUMMARY OF THE INVENTION

The present invention provides a method for creating a small feature attached to a large feature while maintaining control over the depth profile of the transition region between the features. In an alternative embodiment, the method allows for creation of attached features of similar sizes while maintaining control over the depth profile of the transition region. In the inventive method, a substrate is provided which has one or more protective layers over the substrate. Typically one protective layer of $SiO_2$ is present, but layers of other materials such as $Si_3N_4$ may also be used as protective layers. The substrate is typically composed of silicon, but other substrate materials may be used if a suitable orientation dependent etchant is available for the material.

A first layer of patterned photoresist is formed on the substrate. This first patterned photoresist layer provides definition for a small feature, a large feature, and a separating barrier between the small feature and the large feature, as well as pattern definitions for any other features which it is desirable to transfer to the substrate. In an alternative embodiment, the first patterned photoresist layer provides definition for two features separated by a barrier, as well as pattern definitions for any other features which it is desirable to transfer to the substrate.

After forming the patterned photoresist layer, successive steps transfer the pattern first to the protective layer or layers and then to the substrate. The exact nature of the pattern transfer step depends on the material which must be etched to accomplish the transfer. For an $SiO_2$ protective layer, the pattern transfer is carried out by exposing the wafer to a buffered oxide etch solution. Pattern transfer into the substrate is accomplished by exposing the substrate to an orientation dependent etchant, such as EDP or KOH. The patterned photoresist may be removed at any time after the first of the transfer steps.

Once the first pattern is transferred into the substrate, a second layer of patterned photoresist is formed on the surface. Now that the surface is no longer planar, a spray-on technique for photoresist application is preferred. Other photoresist application techniques such as lamination, spincoating, or electrophoretic deposition may also be used if a suitable degree of planarity control can be achieved. The pattern in the photoresist provides for exposure of the protective layer or layers which reside on the separating barrier created by the previous pattern transfer steps.

The exposed protective layer or layers above the separating barrier are then etched away. Once again, the nature of this removal step depends on the composition of the protective layers. For example, the wafer could be exposed to a buffered oxide etch solution to remove $SiO_2$, or the wafer could be exposed to hot $H_3PO_4$ for removal of $Si_3N_4$. After removal of the protective layers, the separating barrier itself is etched with an orientation dependent etchant, leading to formation of the transition region and production of the final structure of a small feature attached to a large feature.

DETAILED DESCRIPTION OF PREFERRED EMBODIMENTS

Figure 1:
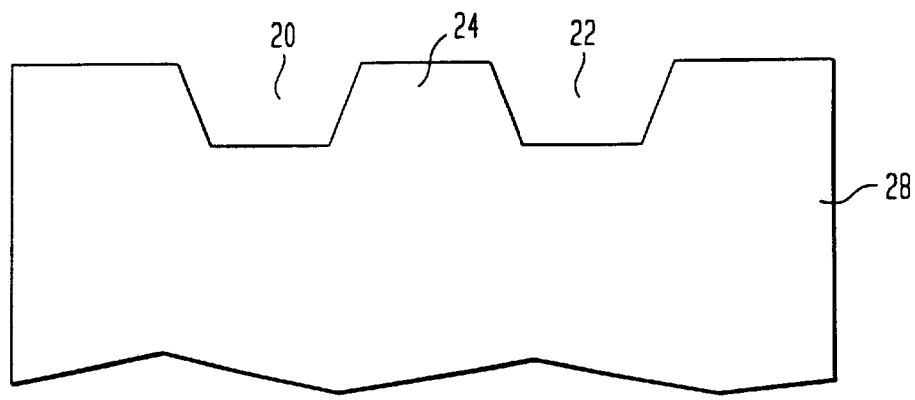
FIG. 1 is a schematic cross-sectional view of a substrate with two features which are near each other.
Figure 2:
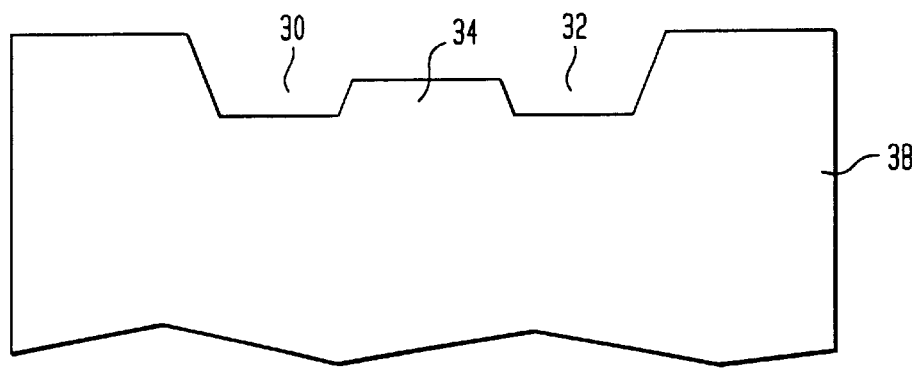
FIG. 2 is a schematic cross-sectional view of a substrate with two features which are attached.
Figure 3:
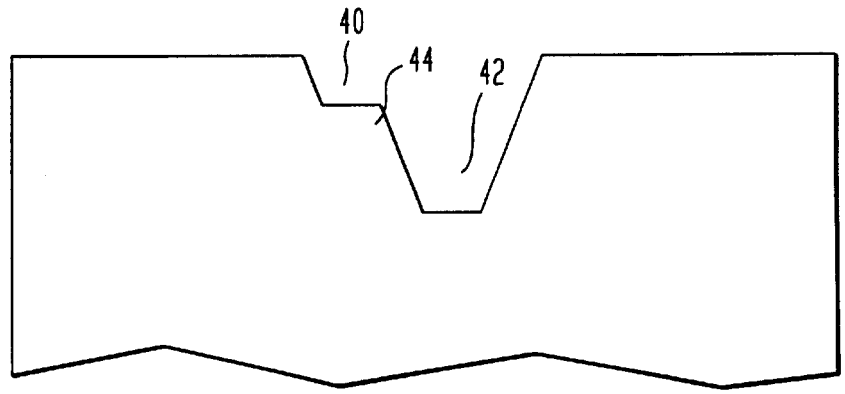
FIG. 3 is a schematic cross-sectional view of a substrate with two features which are attached.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that structural, logical, chemical, and electrical changes may be made without departing from the spirit and scope of the present invention.

The terms "wafer" and "substrate" are to be understood as including any semiconductor-based structure which may be beneficially treated by the process of this invention. "Wafer" or "substrate" may include silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. The substrate could also be based on indium phosphide or other materials for which a suitable orientation dependent etchant is available.

In the following detailed description, reference will be made to a number of materials with variable stoichiometry. Materials such as oxides or nitrides of silicon ideally have chemical compositions of $SiO_2$ and $Si_3N_4$, respectively. In actual use, however, oxides and nitrides of silicon may depart from this ideal stoichiometry. When reference is made to a material of potentially variable composition, such reference should be understood to encompass the ideal stoichiometry as well as variations from the ideal structure. Thus, references to $SiO_2$, silicon oxide, or an oxide of silicon are interchangable, as are references to $SiN_4$, silicon nitride, or a nitride of silicon.

The present invention provides a method for creating a small feature attached to a larger, deeper feature while maintaining control over the profile of the transition region between the small and large feature. The method is generally applicable to features with sufficient size disparity. The inventive method will allow for creation of a small feature attached to a large feature which may have about 10 times the surface area of the small feature, about 25 times the surface area of the small feature, or even greater surface area disparities. Further, the maximum depth of the transition region is less than about 25% of the depth of the large feature and the minimum depth of the transition region is greater than the maximum depth of the small feature. Note that when the small feature and large feature are created with orientation dependent etchants, the initial size of the opening used to create the feature roughly correlates with the depth of the feature if the feature is etched to termination. A feature is etched to termination when the (111) surfaces of the feature sidewalls intersect at the bottom of the feature. If a feature is not etched to termination, the bottom of the feature will consist of a (100) surface, or other surface, which intersects with the (111) surfaces of the sidewalls.

Figure 4:
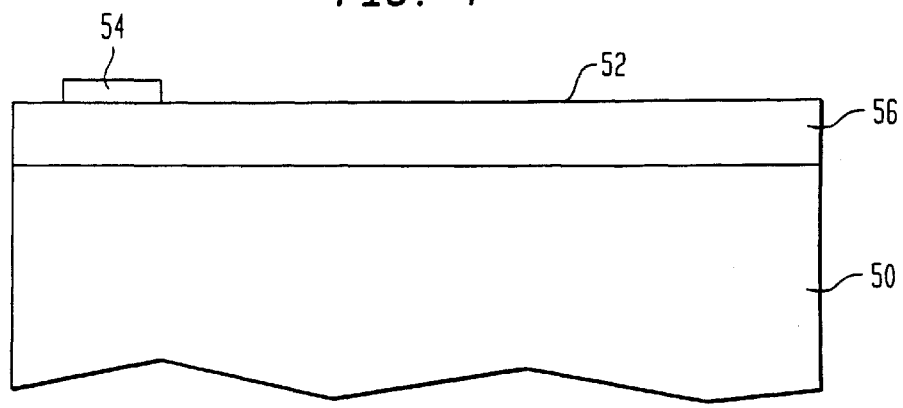
FIG. 4 is a schematic cross-sectional view of a substrate suitable for processing with an embodiment of the invention.

Referring now to the drawings, where like elements are designated with like numerals, FIG. 4 schematically depicts a semiconductor substrate 50 at an intermediate processing stage. Substrate 50 may already have various devices or features on top surface 52, such as bond pad 54 or metal lines (not shown). In this example, substrate 50 is primarily composed of silicon while protective layer 56 is composed of $SiO_2$. Other features may already be embedded in the substrate, such as a via for bonding lower levels of metallization to a surface metal layer or device, or a cavity for holding an object, such as a mirror or another component of a laser assembly. In a preferred embodiment, however, the initial substrate surface is substantially planar. This allows for use of conventional spin-on techniques during application of the first photoresist layer.

In areas where a feature is not already present, such as the eventual location of the attached small and large features, top surface 52 is a part of protective layer 56, which is typically composed of a material such as $SiO_2$. Other materials, such as $Si_3N_4$, may also be suitable as will be apparent from the nature and scope of this invention. Protective layer 56 resides above substrate 50. Although FIG. 4 depicts a single layer 56 of protective material above substrate 50, multiple top layers of protective material could be present above the substrate. Substrate 50 could also be composed of other materials, such as Ge or GaAs, so long as chemistries are available for orientation dependent etching of the alternative materials. If alternative materials are present, the specific method steps used to create the attached small and large features may differ due to the need for alternative etching chemistries, but the spirit of the invention will remain the same.

Figure 5:
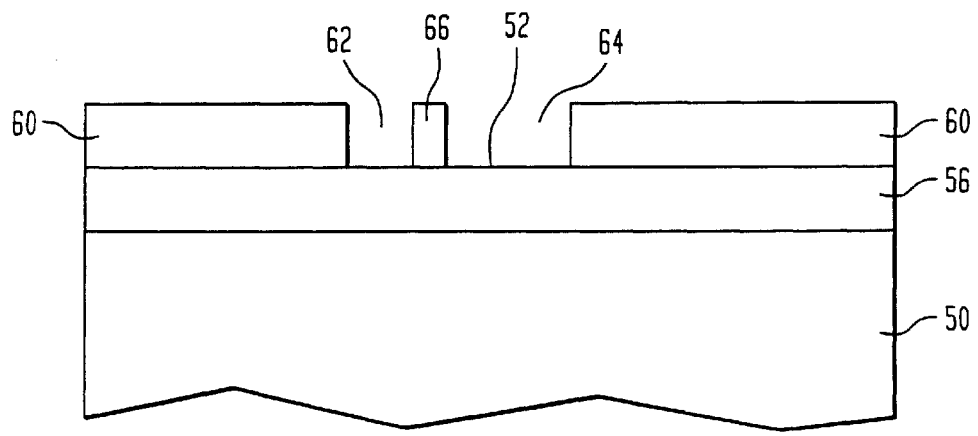
FIG. 5 is a schematic cross-sectional view of La substrate undergoing the process of an embodiment of the invention.

FIG. 5 schematically depicts the portion of substrate 50 in FIG. 4 where the large feature and the attached small feature will be created. The substrate is now at a later stage of processing. A layer of photoresist 60 has been formed on top surface 52. This photoresist has been patterned to leave gap 62 in the photoresist for definition of the small feature and gap 64 for the definition of the large feature. Gaps 62 and 64 are separated by a photoresist wall 66. The $SiO_2$ or other exposed material of top surface 52 can now be etched through gaps 62 and 64. A blanket photoresist layer (not shown) is also formed on the bottom surface of the substrate to protect the bottom surface. The bottom surface photoresist layer is not patterned as no processing is required on the bottom surface of the wafer.

Note that the bottom surface photoresist layer is only necessary if the bottom surface is composed of a material which will be susceptible to attack by the etchants used to treat the top surface of the wafer. For example, if the bottom surface of the wafer is composed of $SiO_2$, the photoresist layer is only necessary if the substrate will be treated with an etchant which attacks $SiO_2$.

Next, the pattern is transferred from photoresist layer 60 to the underlying substrate. The exact form of this step will depend on the nature of the top surface of the substrate. The substrate will be covered with one or more protective top layers 56, such as a layer of $SiO_2$. As a result, two or more process steps will be necessary for complete transfer of the pattern into the substrate.

In the first pattern transfer steps, exposed areas of protective layer 56 are removed with a suitable etchant. For example, in the case of an $SiO_2$ top layer, a BOE solution may be used to remove the oxide layer. In the case of an $Si_3N_4$ protective layer, a solution of hot phosphoric acid may be used to remove the nitride layer. In a preferred embodiment, a substrate with an exposed $SiO_2$ protective top layer is treated with a BOE solution at approximately 20° C. In other embodiments, the substrate is treated with a BOE solution at a temperature between approximately 15° C. and approximately 25° C. The process of removing exposed protective layers is repeated until all of these layers have been removed in exposed areas. Once all of the protective layers are removed, a final pattern transfer step using an orientation dependent etchant is carried out to transfer the pattern to substrate 50.

Once the initial pattern transfer step has occurred between the photoresist layer 60 and the substrate 50, any remaining photoresist may be removed from the substrate, including photoresist present on the bottom surface of the layer. For example, if a wafer comprises an $SiO_2$ top layer over a silicon substrate, the photoresist may be removed once the pattern has been transferred to the $SiO_2$ top layer. The photoresist may be removed by any suitable technique which is compatible with the exposed surfaces on the substrate. Such techniques could include exposure of the substrate to organic stripping solutions, ozonated water, or oxygen ashing.

In general, the final pattern transfer step will involve exposing the substrate to an orientation dependent etchant. If the substrate 50 is composed of silicon, suitable orientation dependent etchants include ethylene diamine pyrocatechol (EDP) and strong bases which donate OH—, such as KOH. Additional care should be taken when KOH is used as the orientation dependent etchant, as KOH will also etch $SiO_2$, a common protective layer material, at an appreciable rate. In alternative embodiments, solutions involving hydrazine may also be used. Because EDP and KOH are orientation dependent etchants, the etch rate of silicon in these etchants depends on the particular crystalline facet which is exposed to the etchant. For example, typical etch rates for silicon in EDP at 107° C. are 60–70 microns per hour on a (100) surface, but only 1–3 microns per hour on a (111) surface. In other embodiments, a substrate might be exposed to EDP at temperatures between approximately 100° C. and approximately 115° C. Temperatures above 115° C. may be impractical due to the fact that EDP boils at this temperature. On the other hand, as the temperature of the EDP solution is reduced, the solubility of etch products in the EDP solution drops to levels which can lead to processing problems. As noted above, orientation dependent etchants for silicon are particularly suitable for creating pyramidal etch features in a silicon substrate.

Figure 6:
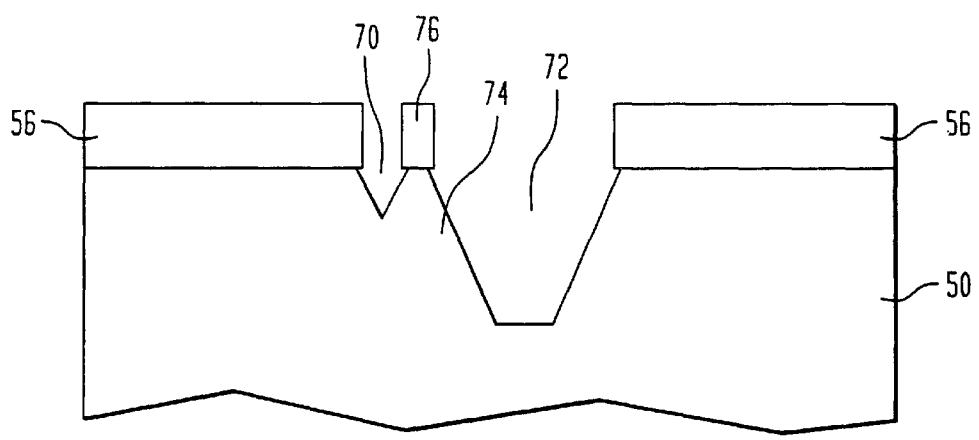
FIG. 6 shows the substrate of FIG. 5 at a processing step subsequent to that shown in FIG. 5.

The substrate is exposed to the orientation dependent etchant for a time sufficient to create small feature 70 and large feature 72, as shown in FIG. 6. Due to the self-limiting nature of the orientation dependent etch, overexposing the small feature leads to only a minimal amount of additional etching. Generally the etch will be performed for a time sufficient to completely form (111) surfaces within the small feature. For the large feature, the etch may proceed for a sufficient time to also completely form (111) surfaces in the large feature, or the etch may be stopped prior to this point. If the etch process is terminated before fill formation of (111) surfaces in the large feature, the large feature will be composed of (111) surfaces which terminate in a flat (100) bottom surface. In either case, other features may be created on the substrate during this etch process.

Figure 7:
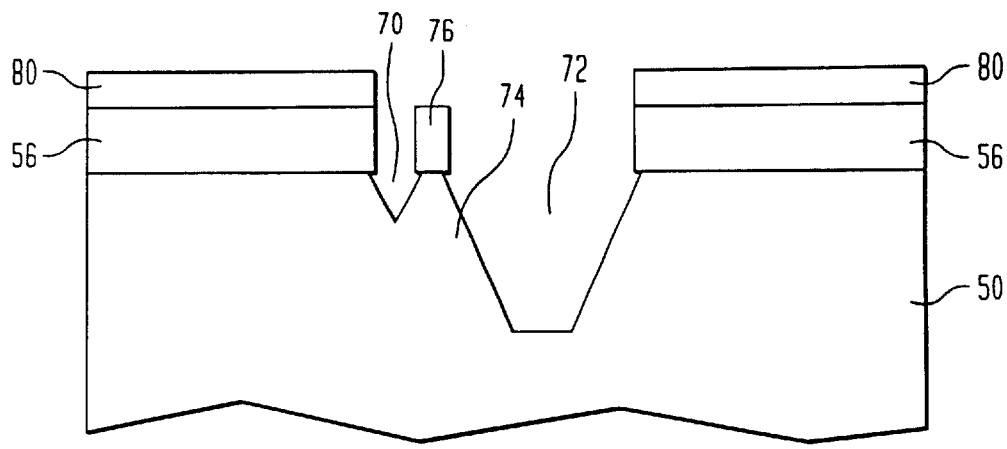
FIG. 7 shows the substrate of FIG. 5 at a processing step subsequent to that shown in FIG. 6.

FIG. 6 also depicts separating barrier 74 and barrier cap 76, which remain between small feature 70 and large feature 72 after completion of the pattern transfer step. In this example substrate, separating barrier 74 is composed of silicon while barrier cap 76 is composed of $SiO_2$. Although barrier cap 76 on top of separating barrier 74 protects the barrier from direct attack by the etchant, separating barrier 74 is still etched slowly due to undercutting of protective layer 56 and barrier cap 76 during formation of the small and large feature. This is represented in FIG. 7 by the small overhang of protective layer 56 over small feature 70 and large feature 72. In a preferred embodiment, the final width of separating barrier 74 after the pattern transfer step will be between about 1 micron and about 14 microns. Thus, the initial spacing in FIG. 5 between gaps 62 and 64 in the patterned photoresist layer 60 used to form separating barrier 74 must be adjusted to account for the loss of material which will occur due to undercutting of barrier cap 76 during the pattern transfer.

Note that FIG. 6 represents the continuation of processing on a sample substrate. In other embodiments, alternative materials could be selected for the protective layer, such as $Si_3N_4$. In these embodiments, barrier cap 76 would be composed of the alternative protective layer material. In still yet other embodiments, the substrate material could be a material other than silicon.

Once the small feature 70 and large feature 72 are formed, a second layer of patterned photoresist is formed on the substrate. Due to the fact that a relatively large feature is now present on the surface of the substrate, traditional spin-on techniques for application of photoresist may not be effective. An alternative method for applying photoresist at this point is to spray on the photoresist. In a preferred embodiment, photoresist is applied to the substrate by first preparing a solution of Shipley 1818 photoresist which is thinned with a thinner, such as Shipley Type P thinner. This thinner is primarily composed of propylene glycol monomethyl ether acetate. In a preferred embodiment, the thinned photoresist solution is composed of approximately 70%

Shipley Type P thinner, approximately 30% Shipley 1818 photoresist, and approximately 0.2% FC 430. This last component is a flow control agent available from the 3M corporation. This thinned photoresist is then sprayed on to the surface of the wafer. Other methods for applying photoresist in this circumstance will be apparent to those skilled in the art. After soft-baking the top photoresist layer, a photoresist layer is also applied to the bottom surface of the wafer and then soft-baked.

After the soft-bake, this second photoresist layer is patterned. FIG. 7 shows second photoresist layer 80 after patterning on the sample substrate. In FIG. 7, the photoresist on top of barrier cap 76 has been developed away. As a result, barrier cap 76 is now susceptible to chemical treatment while the remainder of the surface is protected with photoresist.

Figure 8:
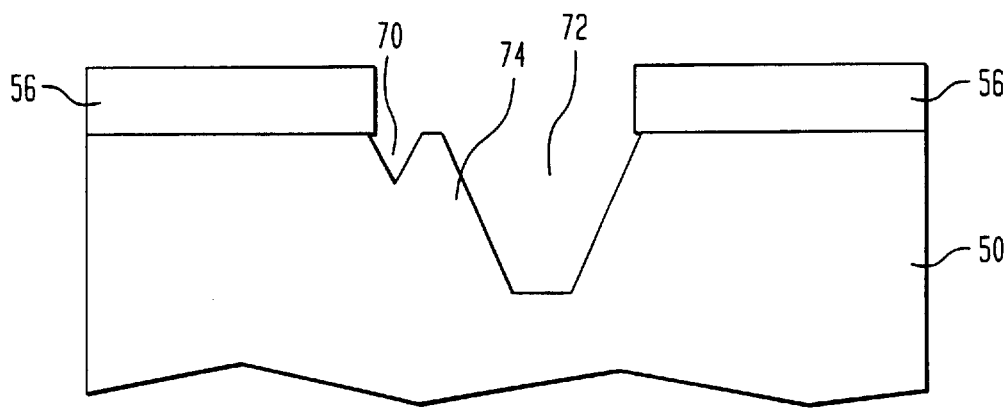
FIG. 8 shows the substrate of FIG. 5 at a processing step subsequent to that shown in FIG. 7.

After patterning second photoresist layer 80, the separating barrier 74 is removed via etching. As before, the exact nature of the barrier removal etch process will depend on the type of substrate material and the number of protective layers present on the surface. FIG. 8 depicts the start of the wall removal etching process for the sample substrate. After patterning second photoresist layer 80, the substrate is treated with BOE. The BOE removes the exposed $SiO_2$ barrier cap 76. Once again, in a preferred embodiment the substrate is treated with the BOE at 20 C. In alternative embodiments, the substrate could be treated with BOE at other temperatures, especially between approximately 15 C. and 25 C. This exposes separating barrier 74 for additional processing. $SiO_2$ in other areas of the surface is largely unaffected due to the presence of second photoresist layer 80 as well as the blanket layer of photoresist formed on the bottom surface of the wafer. After removal of barrier cap 76, second photoresist layer 80 and the bottom surface photoresist layer are stripped from the surface by a suitable method. The structure shown in FIG. 8 is now ready for removal of separating barrier 74 in order to allow attachment of small feature 70 and large feature 72.

Figure 9:
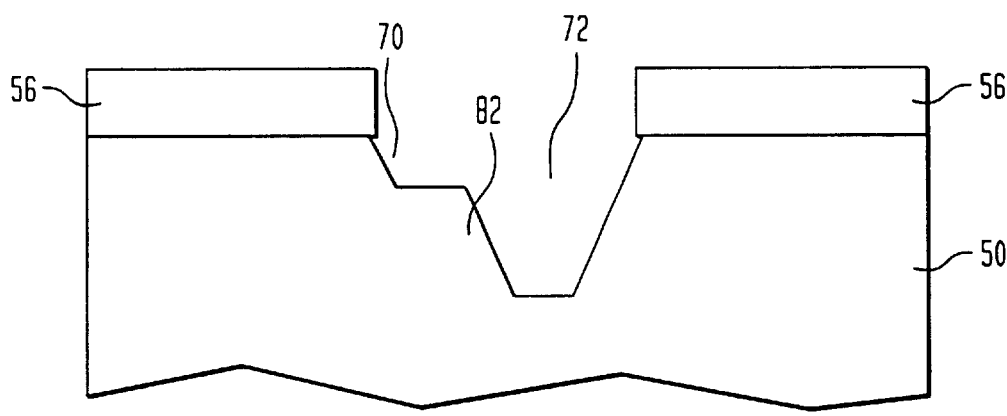
FIG. 9 shows the substrate of FIG. 5 at a processing step subsequent to that shown in FIG. 8.

The substrate is then exposed to an orientation dependant etchant, such as EDP. Due to the nature of the structure of separating barrier 74, the etch rate of separating barrier 74 is greater than the typical etch rate for a (100) surface. At 107° C., the etch rate of separating barrier 74 is typically between about 250 microns per hour and about 300 microns per hour. FIG. 9 shows the resulting substrate where separating barrier 74 has been removed. Removal of separating barrier 74 has resulted in formation of transition region 82 between small feature 70 and large feature 72. In FIG. 9, transition region 82 is defined as the region beginning at the bottom of the small feature 70 and ending at the point where the sidewall of large feature 72 is once again a (111) surface.

In other embodiments, the etch process for removal of the separating barrier will vary to account for different substrates. For example, instead of a barrier cap 76 composed of $SiO_2$, the separating barrier may be protected by a barrier cap composed of $Si_3N_4$, requiting an alternative etch chemistry such as hot phosphoric acid.

Figure 10:
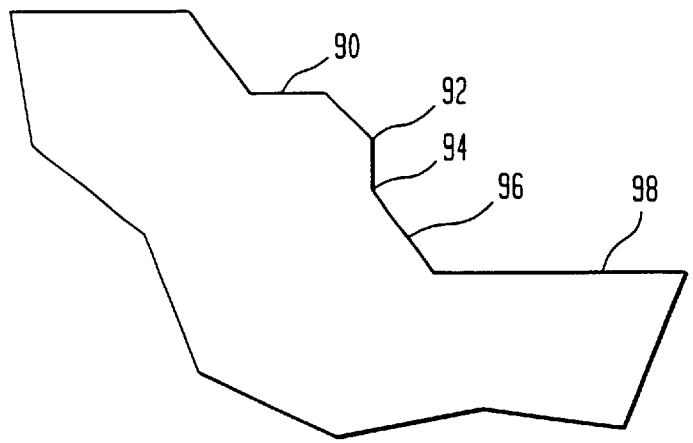
FIG. 10 schematically represents a sample depth profile of a substrate processed according to the invention.

FIG. 10 depicts a typical profile of the depth of the surface traced along a line starting in the small feature, through the transition region, and into the bottom of the large feature. Plateau 90 shows the final depth of the small feature. First transition point 92 and second transition point 94 identify positions in the transition region between the small feature and the large feature. Sidewall region 96 is the expected (111) surface formed in the large feature by the orientation dependent etch. Finally, bottom plateau 98 represents the bottom of large feature. As noted above, the transition region begins at the edge of plateau 90 and continues until the second transition point 94, where the sidewall becomes a (111) surface. Note that the bottom of the small feature is represented as a plateau 90 for ease of visual inspection. FIG. 10 only indicates the maximum depth of the small feature without necessarily indicating the nature or shape of that feature.

Note that the method of the present invention allows for reproducible control over both the depth and width profiles on the surface where the bottom of the small feature intersects with the large feature. The small feature can be overetched safely due to the limiting nature of orientation dependent etching. Efforts to etch the small feature at the same time as the separating barrier, however, have led to problems with reproducibility. If the etch is allowed to proceed for too long, the transition region between the small and large feature will continue to etch. In the limiting case, this can result in the small feature having the same depth as the large feature. On the other hand, if the etch is terminated too quickly, a 'bump' may be left in the transition region. The presence of a bump could cause the bottom of the small feature to actually be deeper than some portions of the transition region. In applications such as the laser module described below, the presence of a bump in the transition region can lead to partial blocking or refracting of laser light which is attempting to pass through the attached small feature to a device located in the large feature.

After completion of the inventive method, several additional steps may be taken. As noted above, the long etch required for creation of the large feature can result in overhang of the protective layers over the small feature and large feature. These overhangs can be removed by any suitable method. Another possible follow-up step would be to rinse the wafer after formation of the small feature and the attached large feature. The rinse could include exposure of the substrate to deionized water. Additional intermediate steps might also be included during the inventive process. For example, a rinse might be included after creation of the small and large etch features but prior to formation of the second photoresist layer. Other additional intermediate or follow-on steps, such as alternative rinses, will be apparent to those skilled in the art.

While the above embodiments describe use of the present inventive method for creating attached features of disparate sizes, this inventive method may also be used generally for creating attached features of any size on a surface. In particular, the present method can be used to great advantage in creating attached features of similar sizes when it is desirable for both of the attached features to be relatively deep. The number and types of process steps used to create the attached features of similar size will be basically the same as the process steps used to create a small feature attached to a large feature. The depth profile in the transition region between the features, however, will be different.

Figure 11:
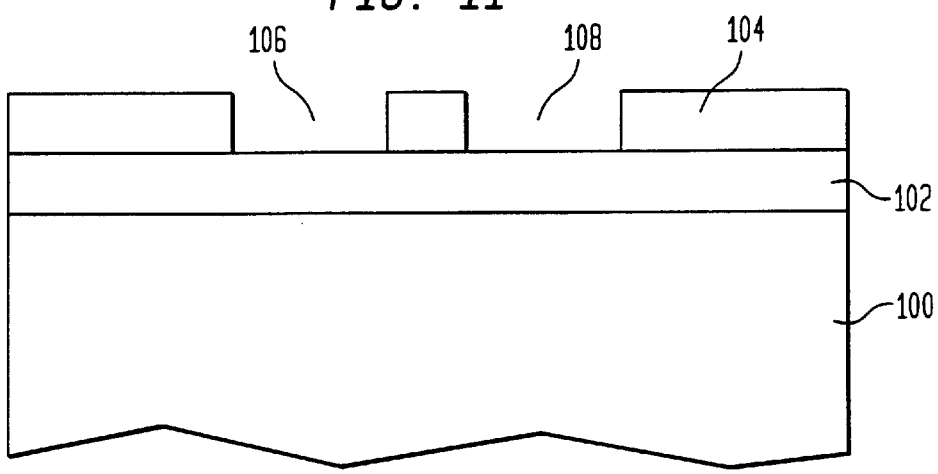
FIG. 11 is a schematic cross-sectional view of a substrate undergoing the process of an alternate embodiment of this invention.

The method for creating attached features of similar sizes generally resembles the method for creating a small feature attached to a large feature. First, a layer of patterned photoresist 104 is formed on a substrate, as shown in FIG. 11. As before, substrate 100 comprises one or more protective layers 102 over an orientation dependent etching material. The primary difference between the substrate shown in FIG. 5 and the substrate shown in FIG. 11 is that gaps 106 and 108 in FIG. 11, where the features will be formed, are about the same size. This is in contrast to small gap 62 and large gap 64 in FIG. 5, which are designed for formation of a small feature and large feature, respectively.

Figure 12:
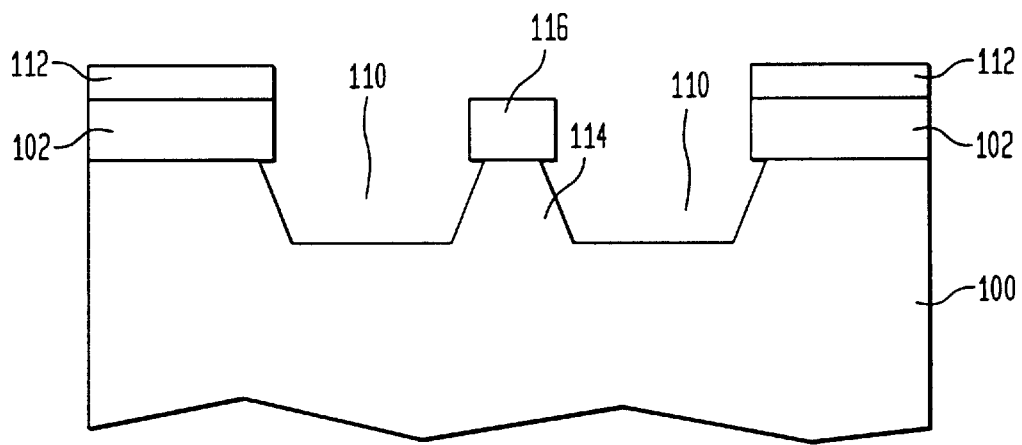
FIG. 12 shows the substrate of FIG. 11 at a processing step subsequent to that shown in FIG. 11.

After forming patterned photoresist layer 104, the pattern is transferred, first to protective layer 102, and then to substrate 100 with an orientation dependent etchant as before. This results in creation of two features 110 of approximately the same size separated by a barrier, as shown in FIG. 12. At this point, a rinse may be inserted as described above. Next, the second layer of patterned photoresist 112 is formed on the surface. Once again, the pattern is designed to allow etching of the barrier 114 between the features.

Figure 13:
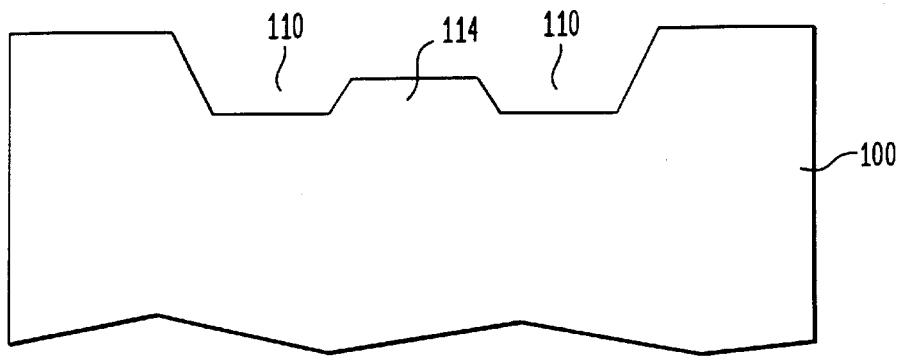
FIG. 13 shows the substrate of FIG. 11 at a processing step subsequent to that shown in FIG. 12.

Once the photoresist is patterned, barrier cap 116 above the barrier is removed. Barrier 114 is then etched with an orientation dependent etchant. In this case, the goal is to remove only a portion of the barrier while retaining as much of the (111) surface character of the barrier sidewalls as possible. The final structure after etching the barrier is depicted in FIG. 13.

When creating features of approximately equivalent size, the depth profile between the attached features will differ from that for features of disparate sizes. Since both features will have similar initial surface areas, both features will also achieve the limiting shape of intesecting (111) surface sidewalls at roughly the same time. As a result, the bottom surfaces of the two attached features will have approximately the same depth.

When etching features of similar size, the desired structure after etching the barrier is to reduce the height of the barrier to a desired level while retaining the (111) surface character of the feature sidewalls for the portion of the barrier which remains after the etch. This latter goal is achieved by using an orientation dependent etchant to remove a portion of the barrier. Because surfaces other than (111) surfaces are exposed at the top of the barrier, however, the orientation dependent etchant can remove the barrier at a much faster rate than would be possible by simply undercutting an etch mask. Thus, the barrier is removed quickly while retaining the (111) surface character of the remaining barrier sidewalls in the features.

Figure 14:
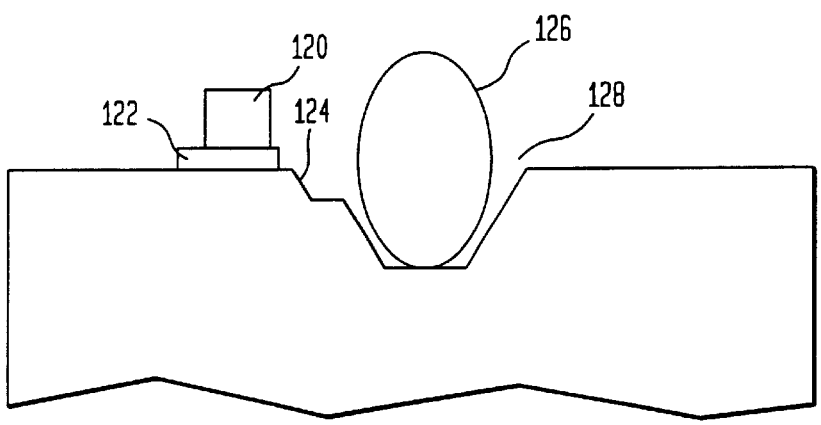
FIG. 14 schematically depicts a laser module on a substrate created in part with the present invention.

For a specific example of the inventive method, consider a laser and ball lens module. FIG. 14 schematically shows the final substrate with laser 120 bonded to bonding pad 122. During operation of the laser, laser light passes from laser 120 through notch 124, a small feature, to ball lens 126 which resides in ball lens cavity 128, a large feature.

Figure 15:
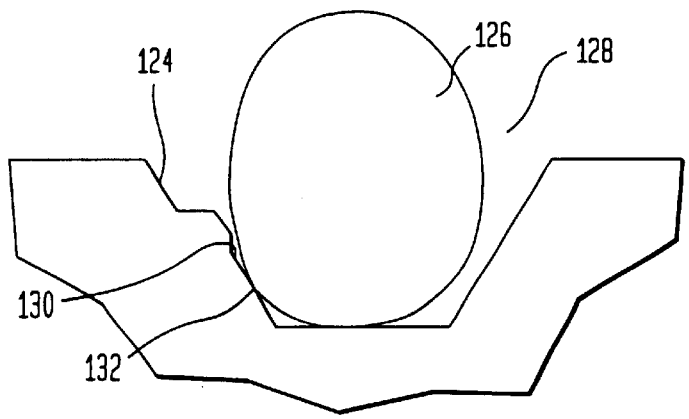
FIG. 15 schematically depicts a portion of the substrate from FIG. 14 in greater detail.

As depicted in FIG. 15, a closer schematic view of the large feature and attached notch, ball lens 126 is held in place in ball lens cavity 128 in part due to bonding to sidewall 130 at attach point 132. The sidewall 130 shown in FIG. 15 is the wall of ball lens cavity 128 where the notch 124 is attached. The attach point 132 is on a (111) surface formed due to the orientation dependent etching of the ball lens cavity 128. This attach point is critical for providing proper bonding of the ball lens 126 to the substrate. If the (111) surface of sidewall 130 is not preserved near the location of attach point 132, ball lens 126 will not be able to contact the sidewall 130, leading to poor bonding to the surface. Thus, control of the profile between notch 124 and the ball lens cavity 128 is necessary to insure proper bonding of ball lens 126.

The required ball lens cavity 128 and attached notch 124 can be readily created by employing the present invention. In this example, a silicon substrate has already been processed to create devices and metal levels on the substrate. Metal bond pads and other metallic features are exposed on some portions of the top surface. The remainder of the top surface is covered with an $SiO_2$ layer with a thickness of approximately 5000 Angstroms. The bottom surface of the substrate is also composed of a layer of $SiO_2$.

In this example, the desired ball lens cavity is a pyramidal cavity with a rectangular surface opening of approximately 962 microns by approximately 2,340 microns and a desired etch depth of approximately 450 microns. The attached notch has a desired surface opening of approximately 100 microns by approximately 100 microns. The size of the surface opening for the attached notch in the first patterned photoresist layer, however will be reduced by the amount needed to create the separating wall. Thus, the desired width for the small feature prior to removal of the separating wall will be between approximately 99 microns and approximately 86 microns. In the transition region, the final depth of the second transition point should be no greater than 170 microns.

A blanket layer of photoresist is applied to the surface. The photoresist is then patterned in the desired locations of the ball lens cavity and the notch. The photoresist is also patterned to define any other surface features which may be beneficially created during a subsequent silicon etch. A blanket layer of photoresist is also applied to the bottom surface of the wafer to protect the oxide layer on the bottom surface.

The substrate is then treated with BOE to transfer the pattern from the photoresist layer into the $SiO_2$ layer. The substrate is exposed to the BOE at room temperature, resulting in an $SiO_2$ etch rate of approximately 700 Angstroms per minute on any area of the substrate where $SiO_2$ is present on the top surface and is not protected by photoresist. The process is continued for a period of time to remove all of the $SiO_2$ in the exposed areas. The substrate may be treated with BOE by immersion in a bath of BOE. Other methods of treating the substrate with BOE, such as spraying, will be apparent to those skilled in the art. Other methods of removing the $SiO_2$ layer from the patterned areas may also be suitable.

After exposing the wafer to BOE, the remaining photoresist on the wafer may be removed by any suitable method. In a preferred embodiment, the wafer is treated with a photoresist stripper such as ACT-150I from Ashland Chemical Co. In another embodiment, the photoresist is consumed by ashing in an oxygen plasma. In yet another embodiment, the photoresist may be removed by treating the substrate with acetone followed by a methanol rinse. Other methods of removing photoresist from the wafer will be apparent to those skilled in the art.

After removing the photoresist, the substrate is treated with an EDP at solution at approximately 107 C. to transfer the features into the silicon. One possible choice of EDP solution is PSE-300F from the Transene Co. Due to the large size of the ball lens cavity, this etch step is performed for approximately 7 hours. This is sufficient to completely form (111) surfaces in the notch, but a (100) surface is still present in the bottom of the ball lens cavity. At the end of the EDP etch, the notch and ball lens cavity are still separated by a silicon wall with an $SiO_2$ wall cap.

After creating the notch and ball lens cavity, a new layer of photoresist is deposited on both the top and bottom surfaces of the wafer. The photoresist on the bottom surface may be deposited by traditional spin-on techniques or other suitable methods. Due to the deep etch pit on the front side of the wafer, however, it is preferable to spray the photoresist on to the front side of the substrate. A suitable photoresist for spray-on application is a Shipley 1818 photoresist thinned with a Shipley thinner. In a preferred embodiment, the spray-on photoresist is a solution composed by weight of approximately 70% Shipley Type P thinner, approximately 30% Shipley 1818 photoresist, and approximately 0.2% FC 430 flow control agent from 3M Co. This photoresist layer is then soft-baked.

After forming the photoresist layer on the surface, the photoresist is patterned to expose the $SiO_2$ cap of the silicon wall between the notch and the ball lens cavity. Once again, the wafer is exposed to BOE at room temperature by a suitable method, such as immersion, to remove the exposed $SiO_2$ wall cap. After removing the $SiO_2$ wall cap, the remaining photoresist on both sides of the wafer is removed by a suitable method, such as stripping by exposure of the substrate to ACT-150I from Ashland Chemical Co.

After removing the photoresist, the substrate is once again treated with an EDP solution at 107° C. Only the silicon underneath the $SiO_2$ wall cap is etched appreciably by the EDP solution. The oxide layer acts as a protective mask for any non-exposed silicon and the EDP solution does not affect metallic features such as bond pads. Silicon is also exposed to the EDP solution within the notch and other features, but almost all of these features already have the limiting (111) planes exposed, so the etch rate is minimal. The exception to this is the ball lens cavity, where a (100) face is still exposed in the bottom of the cavity. The EDP solution continues to etch this feature as usual.

This second EDP etch is performed for 15 minutes. At the end of this etch, the silicon wall between the notch and the ball lens cavity has been removed. The majority of the sidewall of the ball lens cavity, however, has been retained. This will eventually allow for proper attachment of the ball lens to the substrate when the ball lens is bonded to the surface.

As can be seen from the embodiments described herein, the present invention encompasses a method for creating attached features in a substrate while maintaining a desired depth profile in the transition region between the features. In one embodiment, the method allows for creation of a small feature attached to a larger, deeper feature. In another embodiment, the method allows for creation of attached features of similar size with a reduced height barrier between them. The features are created by forming a first patterned photoresist layer and transferring this pattern into the protective top layers and intermediate layers. A separating barrier remains between the features after the first etch step. A second patterned layer of photoresist is then formed to selectively expose only the area above the separating barrier. An initial etch is performed to remove the barrier cap of protective layer material from above the separating barrier, followed by removal of the remaining photoresist. The separating barrier is then removed by etching with a suitable orientation dependent etchant. In one embodiment, the method reproducibly yields a structure where a small feature is attached to a larger feature with a controlled depth profile in the transition region between the small and large feature. In another embodiment, the method reproducibly yields a structure of two attached features with a reduced height barrier with a controlled depth profile between them.

The above description and drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A microelectronic structure in a semiconductor substrate comprising:
    a small feature formed into said substrate to a predetermined depth and having sidewalls which are (111) surfaces;
    a large feature formed into said substrate to a predetermined depth and having sidewalls which are (111) surfaces, wherein said large feature is at least about 10 times as deep as said small feature; and
    a transition region between said small and large features, wherein said transition region has a maximum depth in said substrate which is less than about half the depth of said large feature.

2. The structure of claim 1, wherein said large feature is at least about 25 times as deep as said small feature.

3. The structure of claim 1, wherein the bottom of said large feature is defined by the intersection of sidewalls which are (111) surfaces.

4. The structure of claim 1, wherein the bottom of said large feature is defined by a (100) surface bounded by sidewalls which are (111) surfaces.

5. The structure of claim 1, wherein the maximum depth of the transition region is less than about 25% of the depth of the large feature.

6. The structure of claim 1, wherein the minimum depth of the transition region is greater than the maximum depth of the small feature.

7. A microelectronic structure for use in a laser module comprising:
    a large feature for holding a ball lens, wherein the sidewalls of the feature are (111) surfaces;
    a small feature to provide a pathway for laser light, wherein the sidewalls of the feature are (111) surfaces;
    a metal bonding pad in close proximity to the small feature as a mounting point for a laser; and
    a transition region where the small feature and large feature are attached, wherein said transition region has a maximum depth which is less than half of the depth of the large feature.

8. The structure of claim 7, wherein said large feature is about ten times as deep as said small feature.

9. The structure of claim 7, wherein said large feature is about 25 times as deep as said small feature.

10. The structure of claim 7, wherein the bottom of said large feature is defined by the intersection of sidewalls which are (111) surfaces.

11. The structure of claim 7, wherein the bottom of said large feature is defined by a (100) surface bounded by sidewalls which are (111) surfaces.

12. The structure of claim 7, wherein the maximum depth of the transition region is less than approximately 25% of the depth of the large feature.

13. The structure of claim 7, wherein the minimum depth of the transition region is greater than the maximum depth of the small feature.

* * * * *